United States Patent
Sukegawa et al.

(10) Patent No.: US 10,872,813 B2
(45) Date of Patent: Dec. 22, 2020

(54) METHOD OF MANUFACTURING SEMICONDUCTOR DEVICE

(71) Applicant: Renesas Electronics Corporation, Tokyo (JP)

(72) Inventors: Mitsuhiro Sukegawa, Ibaraki (JP); Yoshinori Matsumuro, Ibaraki (JP); Toshikazu Hanawa, Ibaraki (JP); Kentaro Yamada, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/722,321

(22) Filed: Dec. 20, 2019

(65) Prior Publication Data

US 2020/0126853 A1    Apr. 23, 2020

Related U.S. Application Data

(63) Continuation of application No. 16/016,182, filed on Jun. 22, 2018, now abandoned.

(30) Foreign Application Priority Data

Aug. 2, 2017 (JP) .................................. 2017-149953

(51) Int. Cl.
*H01L 21/288* (2006.01)
*H01L 21/311* (2006.01)
(Continued)

(52) U.S. Cl.
CPC ...... *H01L 21/76838* (2013.01); *H01L 21/288* (2013.01); *H01L 21/31116* (2013.01);
(Continued)

(58) Field of Classification Search
CPC .......................... H01L 21/76877–76883; H01L 2224/0346–03464; H01L 21/2855; H01L 21/288; H01L 21/31116; H01L 21/76829; H01L 21/76838; H01L 21/76895; H01L 23/53223; H01L 24/00; H01L 24/03; H01L 24/05; H01L 2224/0345;
(Continued)

(56) References Cited

U.S. PATENT DOCUMENTS

| 5,711,858 A | 1/1998 | Kontra et al. |
| 6,013,574 A | 1/2000 | Hause et al. |

(Continued)

FOREIGN PATENT DOCUMENTS

JP    2017-069412 A    4/2017

*Primary Examiner* — Eric A. Ward
(74) *Attorney, Agent, or Firm* — SGPatents PLLC

(57) ABSTRACT

To provide a semiconductor device capable of having improved adhesion between a plating film and a wiring layer. A method of manufacturing the semiconductor device includes a step of forming a wiring layer having a surface covered with an oxide film, a step of removing a portion of the oxide film by dry etching to form, in the oxide film, a first opening for exposing a portion of the wiring layer, a step of forming a passivation film covering the wiring layer, is provided with a second opening communicated with the first opening, and is made of an insulating resin material, and a step of growing a plating film on the wiring layer exposed from the first and second openings.

5 Claims, 14 Drawing Sheets

(51) Int. Cl.
*H01L 21/768* (2006.01)
*H01L 23/532* (2006.01)
*H01L 23/00* (2006.01)
*H01L 21/285* (2006.01)

(52) U.S. Cl.
CPC .. *H01L 21/76829* (2013.01); *H01L 21/76895* (2013.01); *H01L 23/53223* (2013.01); *H01L 24/00* (2013.01); *H01L 21/2855* (2013.01)

(58) Field of Classification Search
CPC ... H01L 2224/03464; H01L 2224/0361; H01L 2224/03612; H01L 2224/03622; H01L 2224/039; H01L 2224/0391; H01L 2224/0348; H01L 2224/04042; H01L 2224/05008; H01L 2224/05569; H01L 2224/05582; H01L 2224/05583; H05K 3/108
See application file for complete search history.

(56) References Cited

U.S. PATENT DOCUMENTS

| | | |
|---|---|---|
| 6,319,830 B1 | 11/2001 | Yamaguchi |
| 7,465,653 B2 | 12/2008 | Huang et al. |
| 2003/0068895 A1 | 4/2003 | Kim |
| 2004/0020045 A1 | 2/2004 | Hirano |
| 2004/0115934 A1 | 6/2004 | Broz et al. |
| 2005/0173799 A1 | 8/2005 | Jou et al. |
| 2011/0045668 A1* | 2/2011 | Jeon ........................ H01L 24/03 438/627 |
| 2011/0053374 A1 | 3/2011 | Kobayashi |
| 2015/0235955 A1 | 8/2015 | Kudo et al. |
| 2017/0089957 A1 | 3/2017 | Takada et al. |

\* cited by examiner

METHOD OF MANUFACTURING SEMICONDUCTOR DEVICE

CROSS-REFERENCE TO RELATED APPLICATIONS

The disclosure of Japanese Patent Application No. 2017-149953 filed on Aug. 2, 2017 including the specification, drawings, and abstract is incorporated herein by reference in its entirety.

BACKGROUND

The present invention relates to a method of manufacturing a semiconductor device.

The semiconductor device described in Japanese Unexamined Patent Application Publication No. 2017-69412 (Patent Document 1) has conventionally be known. The semiconductor device described in Patent Document 1 has a semiconductor substrate, a wiring layer, a passivation film, and a plating film. The wiring layer is placed on the semiconductor substrate. The wiring layer contains aluminum (Al). The passivation film is placed to cover the wiring layer therewith. The passivation film is provided with an opening. The passivation film is made of an insulating resin material. From the opening, the wiring layer is exposed. The plating film is placed on the wiring layer exposed from the opening.

In the manufacturing steps of the semiconductor device described in Patent Document 1, firstly, the wiring layer is formed. Secondly, the passivation film is formed. Thirdly, the plating film is grown on the wiring layer exposed from the opening provided in the passivation film.

PATENT DOCUMENT

[Patent Document 1] Japanese Unexamined Patent Application Publication No. 2017-69412

SUMMARY

A wiring layer is formed by patterning a material configuring the wiring layer formed by sputtering or the like by photolithography and etching. A photoresist used for photolithography is removed by ashing. During ashing, the surface of the wiring layer is oxidized. The wiring layer has therefore a surface covered with the resulting oxide film.

This oxide film becomes an obstacle to the growth of a plating film on the wiring layer. As one method for removing this oxide film, dry etching of the oxide film via an opening provided in the passivation film can be considered. During such dry etching, however, carbon derived from the passivation film may be redeposited onto the wiring layer. The carbon which has been redeposited onto the wiring layer becomes an obstacle for the growth of a plating film on the wiring layer.

Presence of the obstacle to the growth of a plating film may result in insufficient adhesion between the wiring layer and the plating film and insufficient adhesion between the wiring layer and the plating film may cause separation of the plating film from the wiring layer during wire bonding or the like to the plating film.

The other problems and novel features will be apparent from the description herein and accompanying drawings.

A method of manufacturing a semiconductor device according to one embodiment includes a step of forming a wiring layer, a step of forming a first opening, a step of forming a passivation film, and a step of causing the growth of a plating film. In the forming wiring layer, a wiring layer having a surface covered with an oxide film is formed on a semiconductor substrate. In the forming first-opening, a portion of the oxide film is removed by dry etching to form, in the oxide film, a first opening for exposing therefrom a portion of the wiring layer. In the forming passivation film, a passivation film is formed which covers the wiring layer, is provided with a second opening communicated with the first opening, is and made of an insulating resin material. In the plating film growth step, a plating film is grown on the wiring layer exposed from the first opening and the second opening.

The method of manufacturing a semiconductor device according to the one embodiment can improve adhesion between the plating film and the wiring layer.

DETAILED DESCRIPTION

Figure 1:
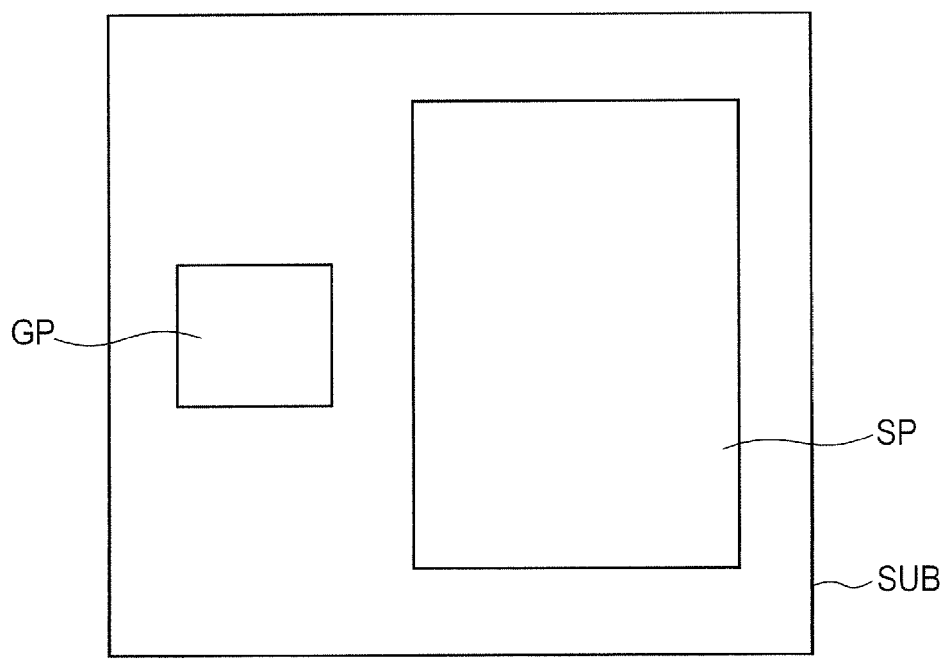
FIG. 1 is a plan view of a semiconductor device of First Embodiment.

Embodiments will be described in detail referring to some drawings. In the drawings shown below, the same portions or portions corresponding thereto will be identified by the same reference numerals and overlapping descriptions will be omitted.

First Embodiment

The configuration of a semiconductor device of First Embodiment will hereinafter be described.

The semiconductor device of First Embodiment is, for example, a trench gate type power MOSFET (metal oxide semiconductor field effect transistor). The semiconductor device of First Embodiment is not limited thereto. The semiconductor device of First Embodiment may be a planar gate type power MOSFET. The semiconductor device of First Embodiment may also be an IGBT (insulated gate bipolar transistor).

Figure 2:
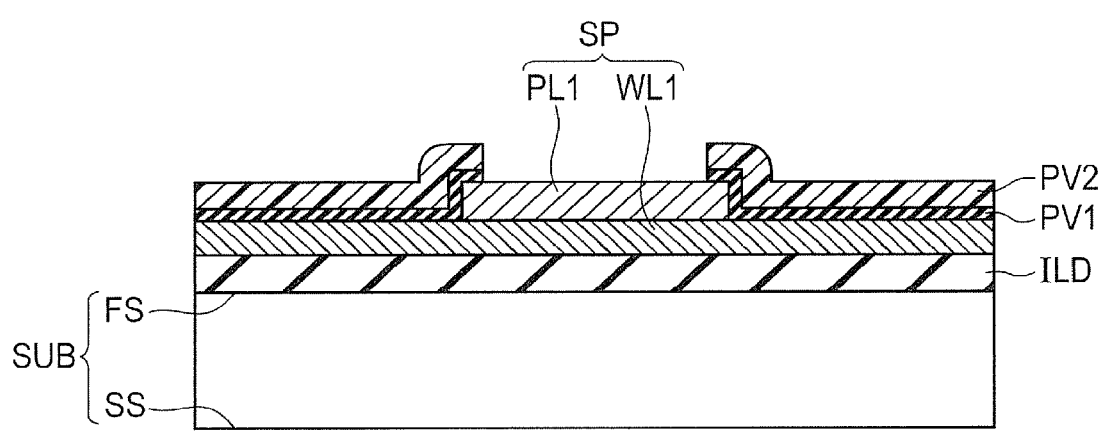
FIG. 2 is a cross-sectional view of the semiconductor device of First Embodiment right below a source pad.
Figure 3:
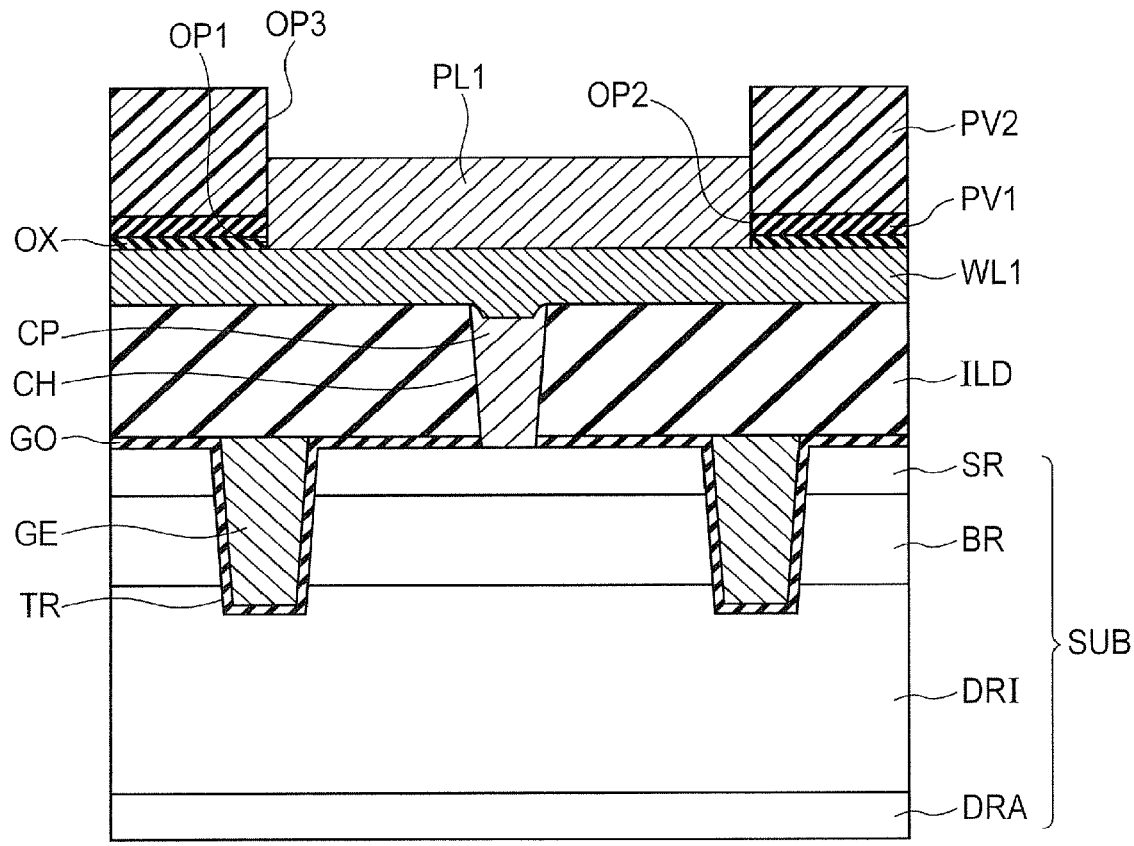
FIG. 3 is an enlarged cross-sectional view of FIG. 2.

As shown in FIG. 1, the semiconductor device of First Embodiment has a gate pad GP and a source pad SP. As shown in FIGS. 2 and 3, the semiconductor device of First Embodiment has a semiconductor substrate SUB, a gate insulating film GO, a gate electrode GE, an interlayer insulating film ILS, a contact plug CP, a wiring layer WL1, a wiring layer WL2, a first passivation film PV1, a second passivation film PV2, a plating film PL1, and a plating film PL2.

The semiconductor substrate SUB is made of, for example, a silicon (Si) single crystal. The semiconductor substrate SUB has a first surface FS and a second surface SS. The second surface SS is a surface opposite to the first surface FS.

The semiconductor substrate SUB has a source region SR, a drain region DRA, a drift region DRI, and a body region BR. The source region SR is placed in the first surface FS. The drain region DRA is placed in the second surface SS. The drift region DRI is placed on the first surface FS side of the drain region DRA. The body region BR is sandwiched between the drain region DRA and the source region SR.

The first surface FS has therein a trench TR. The trench TR extends from the first surface FS toward the second surface SS. The trench TR extends to reach the drift region DRI. From another point of view, the source region SR, the body region BR, and the drift region DRI are exposed from the side wall of the trench TR.

The source region SR, the drain region DRA, and the drift region DRI each have a first conductivity type. The body region BR has a second conductivity type. The second conductivity type is a conductivity type opposite to the first conductivity type. For example, when the first conductivity type is an n type, the second conductivity type is a p type.

The trench TR has, on the side wall and bottom wall thereof, a gate insulating film GO. The gate insulating film GO is made of, for example, silicon dioxide ($SiO_2$). The trench TR has therein a gate electrode GE. More specifically, the gate insulating film GO is sandwiched between the gate electrode GE and the side wall and bottom wall of the trench TR. From another point of view, the gate electrode GE faces with the body region BR (the body region BR exposed from the side wall of the trench TR) sandwiched between the source region SR and the drift region DRI, while being insulated by the gate insulating film GO. The gate electrode GE is made of, for example, impurity-doped polycrystalline Si.

The source region SR, the body region BR, the drift region DRI, the drain region DRA, the gate insulating film GO, and the gate electrode GE configure a trench gate type MOSFET.

The interlayer insulating film ILD is placed on the first surface FS. The interlayer insulating film ILD is made of, for example, $SiO_2$. The interlayer insulating film ILD has therein a contact hole CH. The source region SR is exposed from the interlayer insulating film ILD via the contact hole CH.

The contact plug CP is placed in the interlayer insulating film ILD. More specifically, the contact plug CP is buried in the contact hole CH. The contact plug CP is made of, for example, tungsten (W). The contact plug CP is, at one end thereof, electrically coupled to the source region SR. The contact plug CP is, at the other end thereof, electrically coupled to the wiring layer WL1. The other end of the contact plug CP has, in the vicinity of the center thereof, a portion recessed toward the side of the one end. Although not illustrated, the wiring layer WL2 and the gate electrode GE are electrically coupled to each other via the contact plug CP.

The wiring layer WL1 is a source wiring. The wiring layer WL1 is placed on the interlayer insulating film ILD. The wiring layer WL1 preferably contains Al. The wiring layer WL1 is made of Al or an Al alloy. The Al alloy configuring the wiring layer WL1 is, for example, an AlCu alloy. Alternatively, the Al alloy configuring the wiring layer WL1 may be an AlSi alloy or AlSiCu alloy.

The wiring layer WL1 has a surface covered with an oxide film OX. The term "surface of the wiring layer WL1" as used herein means the surface of the wiring layer WL1 on the side opposite to the interlayer insulating film ILD. The oxide film OX is an oxide of a material configuring the wiring layer WL1. When the wiring layer WL1 contains Al, the oxide film OX is made of an oxide of Al. The oxide film OX has an opening OP1. The wiring layer WL1 is exposed from the oxide film OX via the opening OP1.

The wiring layer WL1 is, for example, a sputter film. The sputter film is a film formed by sputtering. The wiring layer WL1 has a thickness T. The thickness T is preferably 1 μm or more.

In crystal grains at the surface of the wiring layer WL1, a proportion of those having crystal orientation deviated by 5° or less from the <111> plane is preferably 40% or more. The deviation from the <111> plane is determined from the angle made by the normal direction of the crystal plane of the crystal grains at the surface of the wiring layer WL1 and the normal direction of the <111> plane of the crystal grains. The crystal orientation of the crystal grains at the surface of the wiring layer WL1 is measured using X-ray diffraction.

The first passivation film PV1 is placed to cover the wiring layer WL1 therewith. The first passivation film PV1 is made of an insulating inorganic material. The first passivation film PV1 is made of, for example, silicon oxynitride (SiON). Alternatively, the first passivation film PV1 may be made of $SiO_2$ or silicon nitride (SiN).

The first passivation film PV1 has therein an opening OP2. The opening OP2 is placed at a position overlapping with the opening OP1. This means that the wiring layer WL1 is exposed from the first passivation film PV1 via the opening OP1 and the opening OP2.

The second passivation film PV2 is placed to cover the wiring layer WL1 and the first passivation film PV1. The second passivation film PV2 is made of an insulating and photosensitive resin material. The resin material configuring the second passivation film PV2 is preferably a polyimide.

The second passivation film PV2 has therein an opening OP3. The opening OP3 is arranged at a position overlapping with the opening OP1 and the opening OP2. From another point of view, the wiring layer WL1 is exposed from the second passivation film PV2 via the opening OP1, the opening OP2, and the opening OP3.

The plating film PL1 is placed in the opening OP1, the opening OP2, and the opening OP3. In other words, the plating film PL1 is placed on the wiring layer WL1 exposed from the opening OP1, the opening OP2, and the opening OP3.

The plating film PL1 is preferably an electroless plating film. The term "electroless plating film" as used herein means a plating film to be formed by electroless plating. The plating film PL1 is an electroless plating film containing, for example, nickel (Ni). The plating film PL1 may be an electroless plating containing gold (Au). The plating film PL1 may be an electroless plating film containing palladium (Pd). The plating film PL1 may also be a film obtained by stacking two or more of these electroless plating films.

The wiring layer WL1 and the plating film PL1 placed on the wiring layer WL1 configure the source pad SP.

Figure 4:
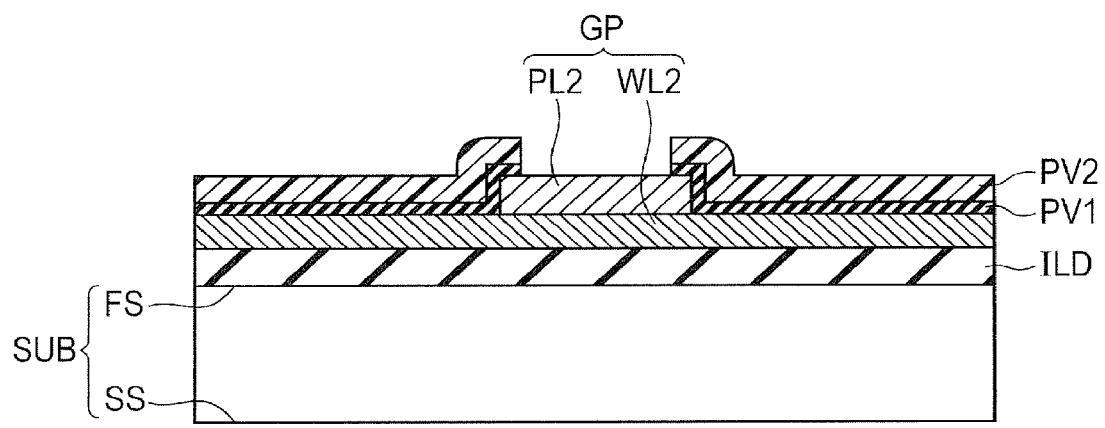
FIG. 4 is a cross-sectional view of the semiconductor device of First Embodiment right below a gate pad.
Figure 5:
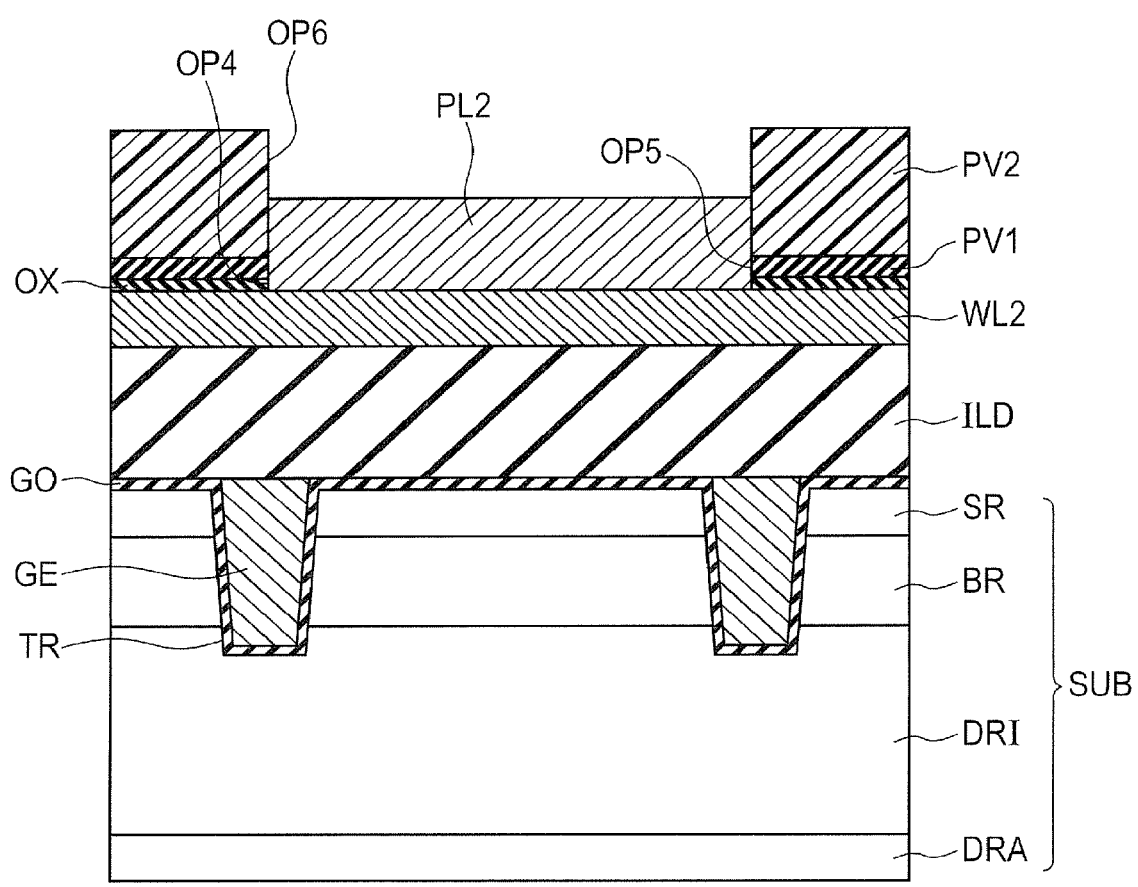
FIG. 5 is an enlarged cross-sectional view of FIG. 4.

The wiring layer WL2 is a gate wiring. As shown in FIGS. 4 and 5, the wiring layer WL2 has a surface covered with an oxide film OX. The wiring layer WL2 is preferably made of the same material as that of the wiring layer WL1. In crystal grains at the surface of the wiring layer WL2, a proportion of those having crystal orientation deviated by 5° or less from the <111> plane is preferably 40% or more. The wiring layer WL2 is covered with the first passivation film PV1 and the second passivation film PV2. The wiring layer WL2 is exposed from an opening OP4 provided in the oxide film OX, an opening OP5 provided in the first passivation film PV1, and an opening OP6 provided in the second passivation film PV2.

The wiring layer WL2 exposed from the opening OP4, the opening OP5, and the opening OP6 has a plating film PL2 thereon. The plating film PL2 is preferably an electroless plating film. The plating film PL2 is, for example, a Ni-containing electroless plating film. The plating film PL2 may be an Au-containing electroless plating film. The plating film PL2 may be a Pd-containing electroless plating film. The plating film PL2 may also be a stack of two or more of these electroless plating films.

The wiring layer WL2 and the plating film PL2 placed on the wiring layer WL2 configure the gate pad GP.

A method of manufacturing the semiconductor device of First Embodiment will hereinafter be described.

Figure 6:
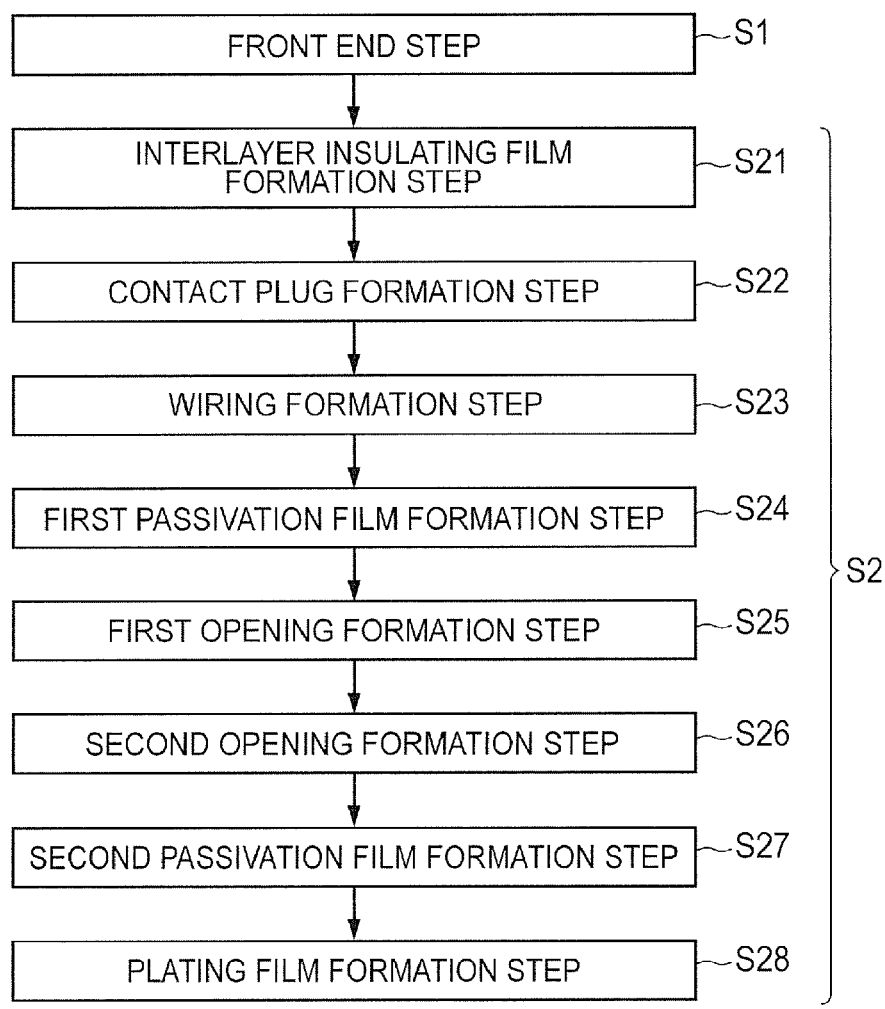
FIG. 6 is a flow chart showing manufacturing steps of the semiconductor device of First Embodiment.

As shown in FIG. 6, the method of manufacturing the semiconductor device of First Embodiment has a front end step S1 and a back end step S2. The back end step S2 has an interlayer insulating film formation step S21, a contact plug formation step S22, a wiring layer formation step S23, a first passivation film formation step S24, a first opening formation step S25, a second opening formation step S26, a second passivation film formation step S27, and a plating film formation step S28.

Figure 7:
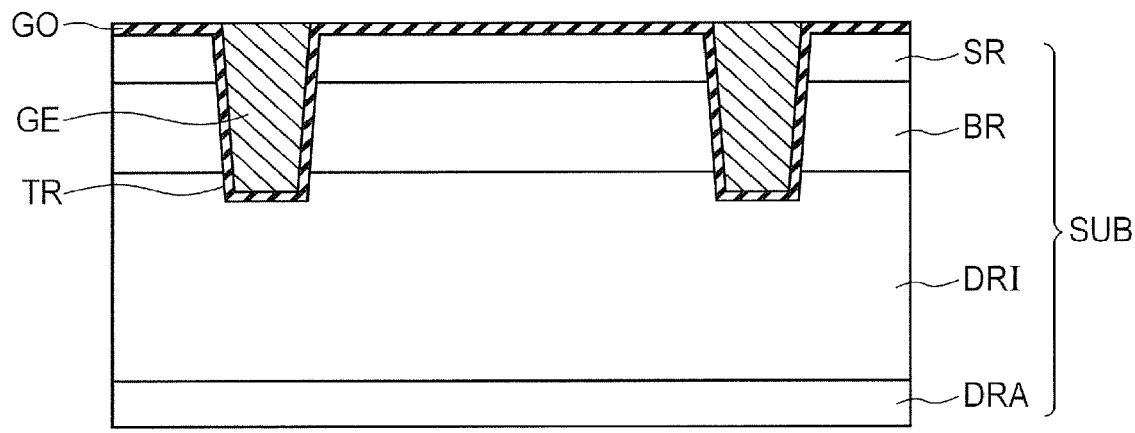
FIG. 7 is a cross-sectional view of the semiconductor device of First Embodiment right below the source pad in a front end step.
Figure 8:
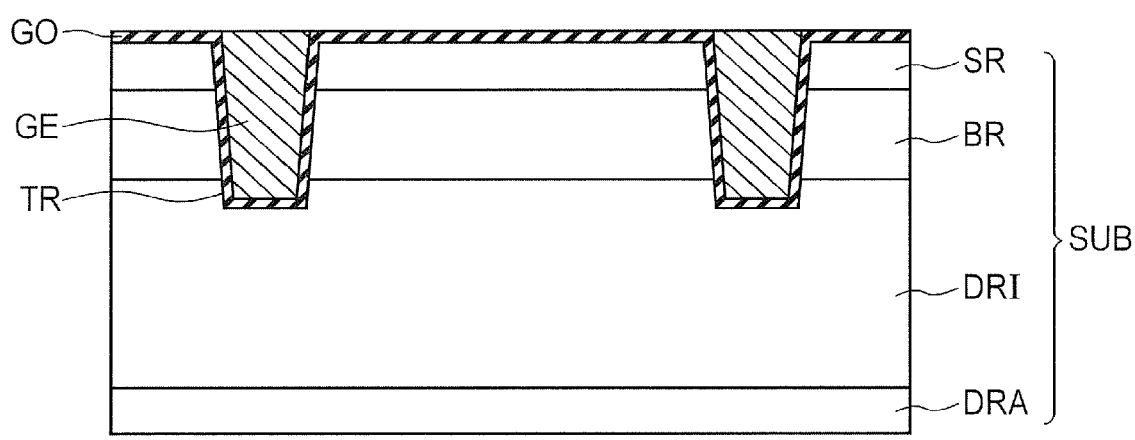
FIG. 8 is a cross-sectional view of the semiconductor device of First Embodiment right below the gate pad in the front end step.

As shown in FIGS. 7 and 8, in the front end step S1, a trench gate type power MOSFET is formed. More specifically, firstly, epitaxial growth of a drift region DRI is performed on a semiconductor substrate SUB having a drain region DRA. Secondly, a body region BR and a source region SR are formed by ion implantation into the semiconductor substrate SUB.

Thirdly, a trench TR is formed in a first surface FS of the semiconductor substrate SUB by anisotropic etching such as RIE (reactive ion etching). Fourthly, a gate insulating film GO is formed by thermal oxidation of the first surface FS of the semiconductor substrate SUB.

Fifthly, a gate electrode GE is formed by filling the trench TR, having on the bottom wall and side wall thereof the gate insulating film GO, with a material configuring the gate electrode GE. Filling of the trench TR with the material configuring the gate electrode GE is performed by forming a film on the first surface of the semiconductor substrate SUB with a material configuring the gate electrode GE by CVD (chemical vapor deposition) or the like and removing a portion of the material configuring the gate electrode GE protruded from the trench TR by CMP (chemical mechanical polishing) or the like.

Figure 9:
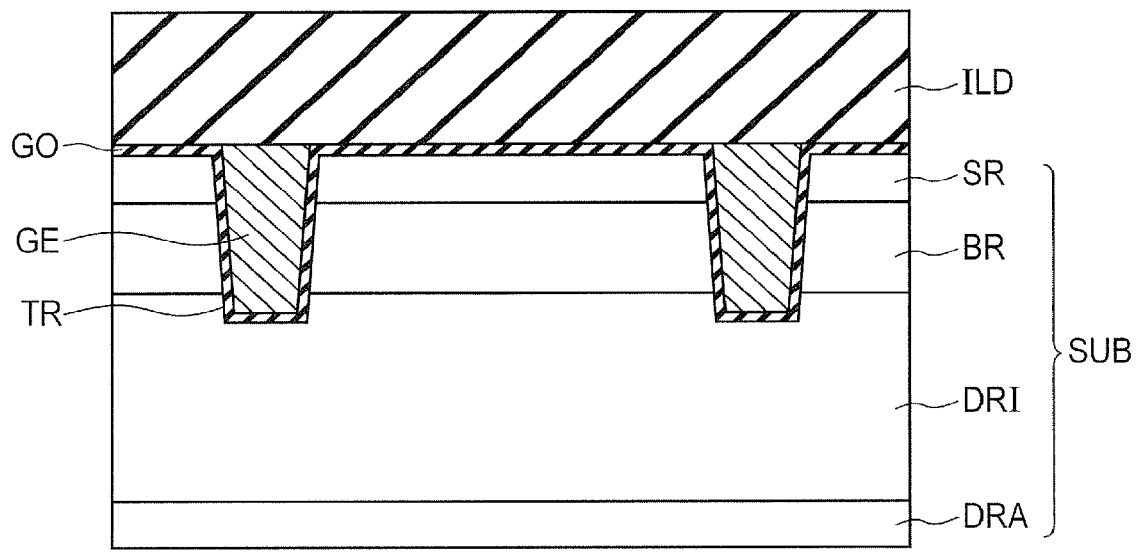
FIG. 9 is a cross-sectional view of the semiconductor device of First Embodiment right below the source pad in a forming interlayer insulating film.
Figure 10:
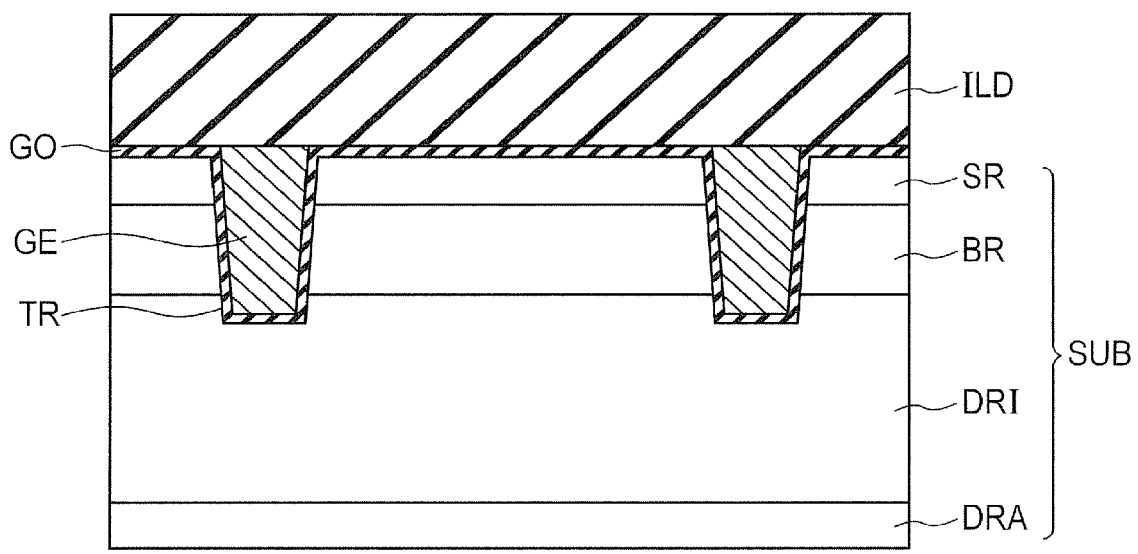
FIG. 10 is a cross-sectional view of the semiconductor device of First Embodiment right below the gate pad in the forming interlayer insulating film.

As shown in FIGS. 9 and 10, in the interlayer insulating film formation step S21, an interlayer insulating film ILD is formed. In forming the interlayer insulating film ILD, firstly, a film is formed by CVD or the like on the first surface FS of the semiconductor substrate SUB by using a material configuring the interlayer insulating film ILD. Secondly, the film formed using the material configuring the interlayer insulating film ILD is planarized by CVD or the like.

Figure 11:
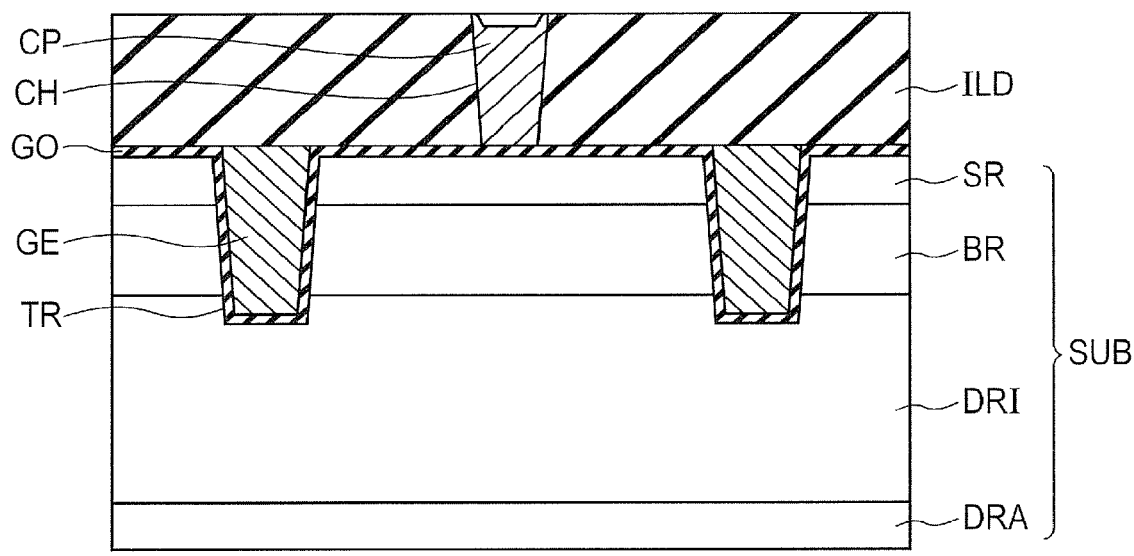
FIG. 11 is a cross-sectional view of the semiconductor device of First Embodiment right below the source pad in a forming contact plug.
Figure 12:
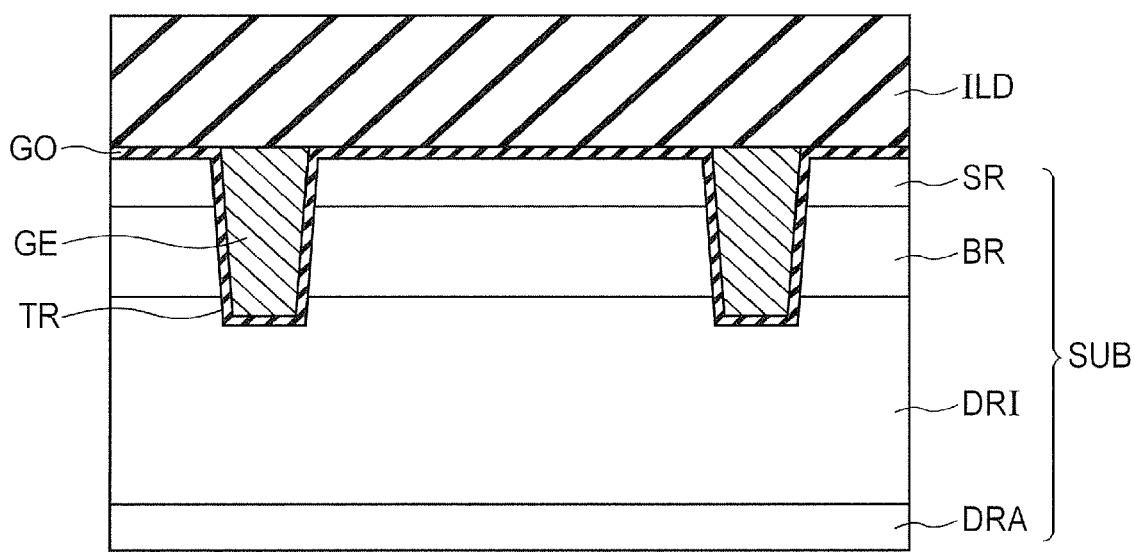
FIG. 12 is a cross-sectional view of the semiconductor device of First Embodiment right below the gate pad in the forming contact plug.

As shown in FIGS. 11 and 12, in the contact plug formation step S22, a contact plug CP is formed. In forming the contact plug CP, firstly, a contact hole CH is formed by anisotropic etching such as RIE.

In forming the contact plug CP, secondly, the contact hole CH is filled with the material configuring a contact plug CP by CVD or the like. Thirdly, a portion of the material configuring a contact plug CP protruded from the contact hole CH is removed, for example, by etch back. Removal of the portion of the material configuring a contact plug CP protruded from the contact hole CH may be performed by CMP.

Figure 13:
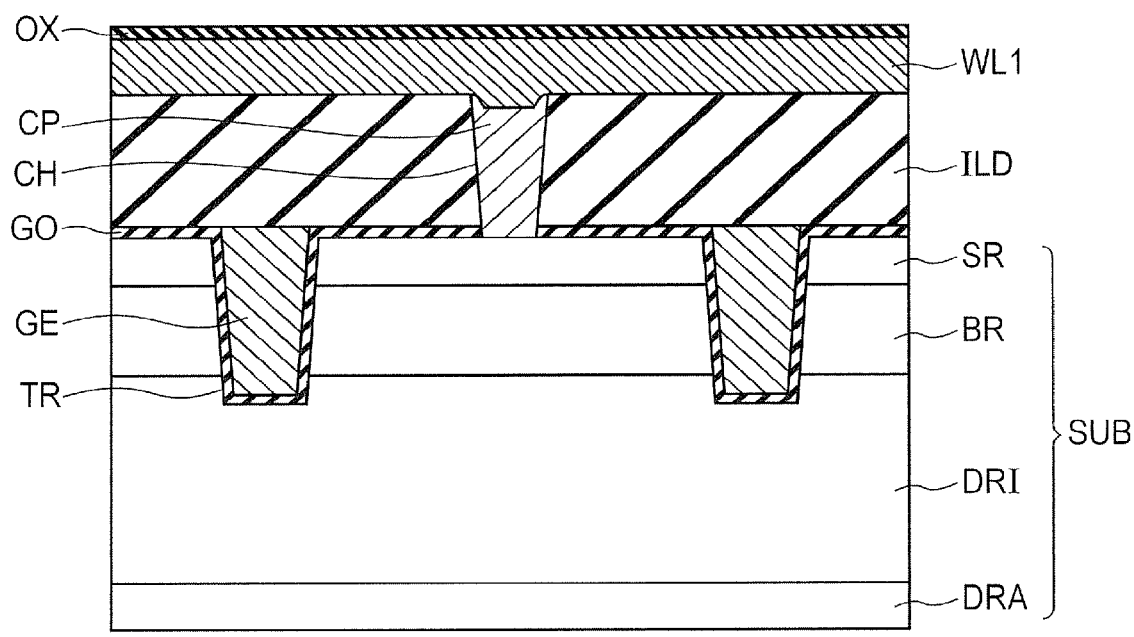
FIG. 13 is a cross-sectional view of the semiconductor device of First Embodiment right below the source pad in a forming wiring layer.
Figure 14:
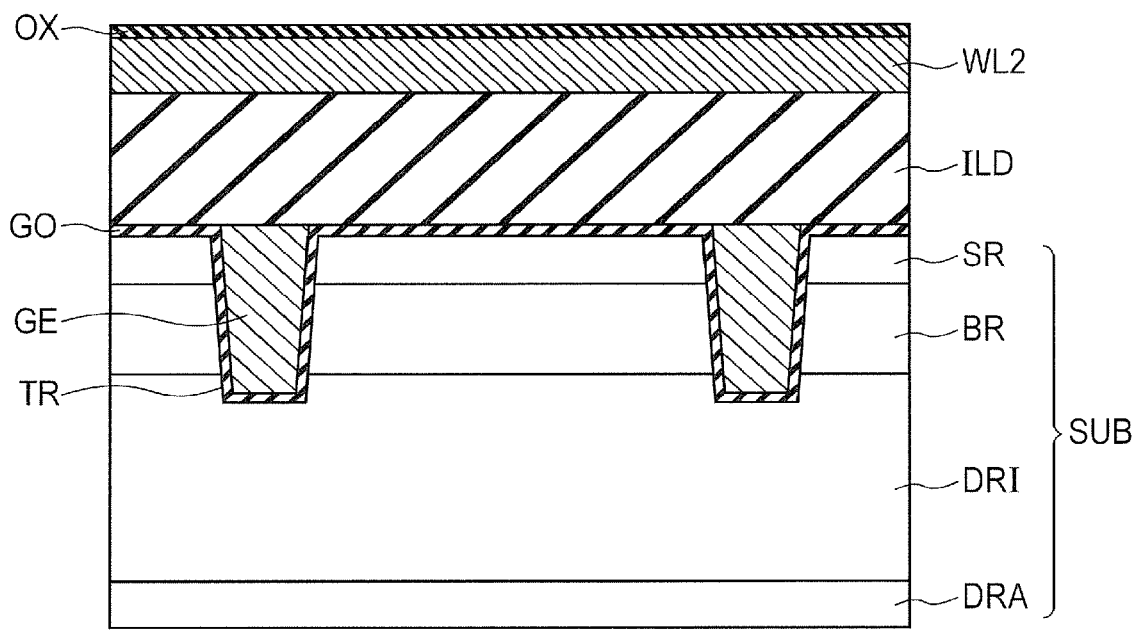
FIG. 14 is a cross-sectional view of the semiconductor device of First Embodiment right below the gate pad in the forming wiring layer.

As shown in FIGS. 13 and 14, in the wiring layer formation step S23, a wiring layer WL1 and a wiring layer WL2 are formed. In forming the wiring layer WL1 and the wiring layer WL2, firstly, films are formed on the interlayer insulating film ILD by using materials configuring the wiring layer WL1 and the wiring layer WL2 by sputtering or the like, respectively. This sputtering is performed preferably at a temperature of 150° C. or more.

In forming the wiring layer WL1 and the wiring layer WL2, secondly, the films formed using the materials configuring the wiring layer WL1 and the wiring layer WL2 are patterned, respectively, by photolithography, etching and the like. By ashing (ashing treatment) of a photoresist film used for photolithography and etching, the surface of the patterned wiring layer WL1 and wiring layer WL2 is oxidized.

As a result, an oxide film OX covering the surface of the wiring layer WL1 and the wiring layer WL2 is formed.

Figure 15:
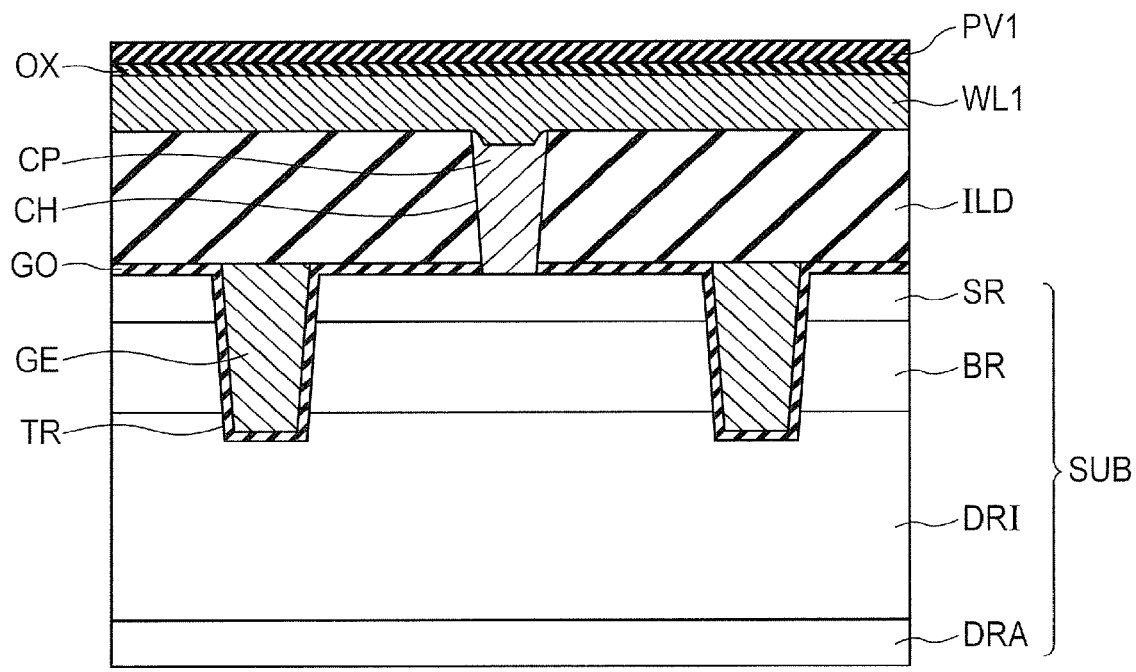
FIG. 15 is a cross-sectional view of the semiconductor device of First Embodiment right below the source pad in a forming first passivation film.
Figure 16:
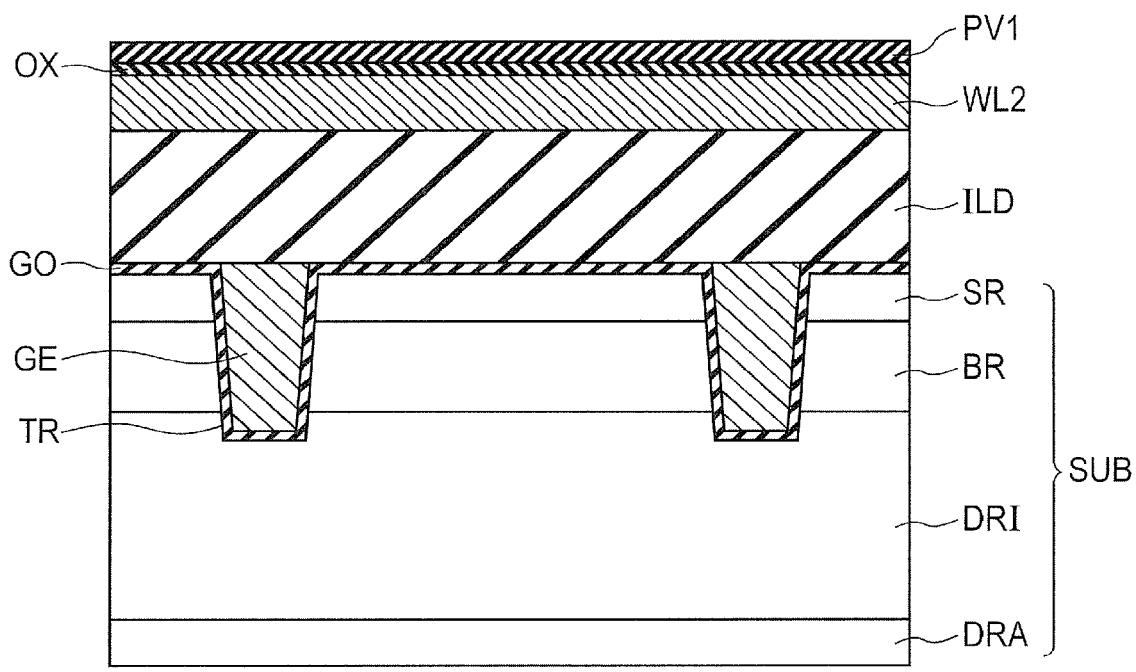
FIG. 16 is a cross-sectional view of the semiconductor device of First Embodiment right below the gate pad in the forming first passivation film.

As shown in FIGS. 15 and 16, in the first passivation film formation step S24, a first passivation film PV1 is formed to cover the wiring layer WL1 and the wiring layer WL2. Formation of the first passivation film PV1 is performed by CVD or the like.

Figure 17:
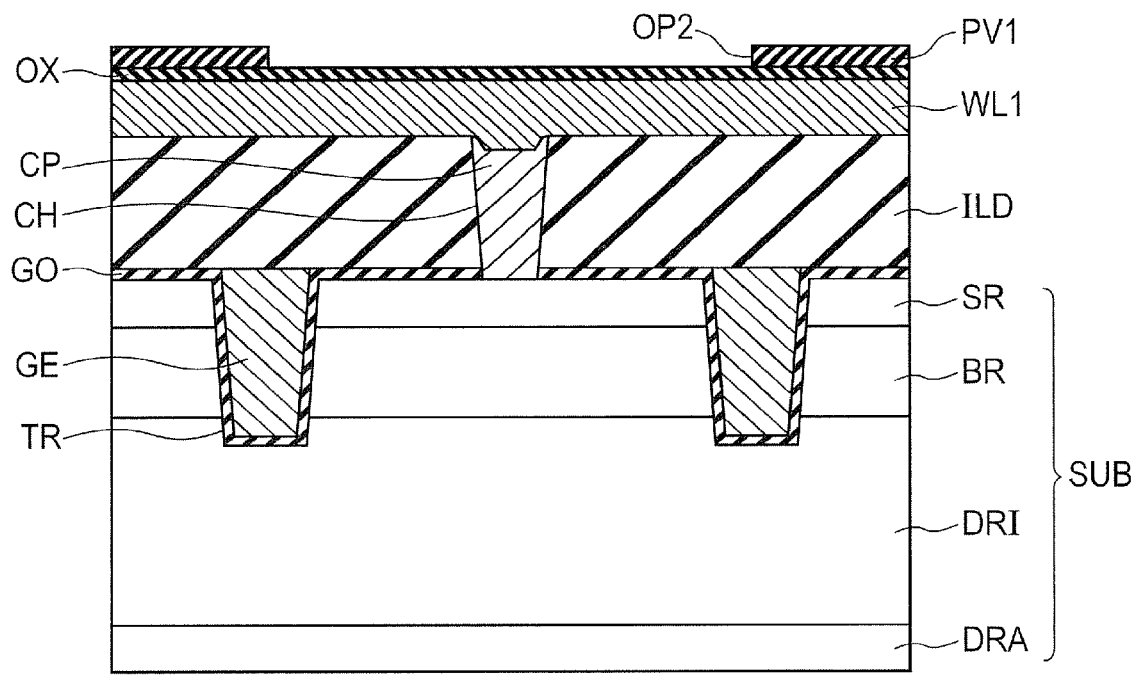
FIG. 17 is a cross-sectional view of the semiconductor device of First Embodiment right below the source pad in a forming first opening.
Figure 18:
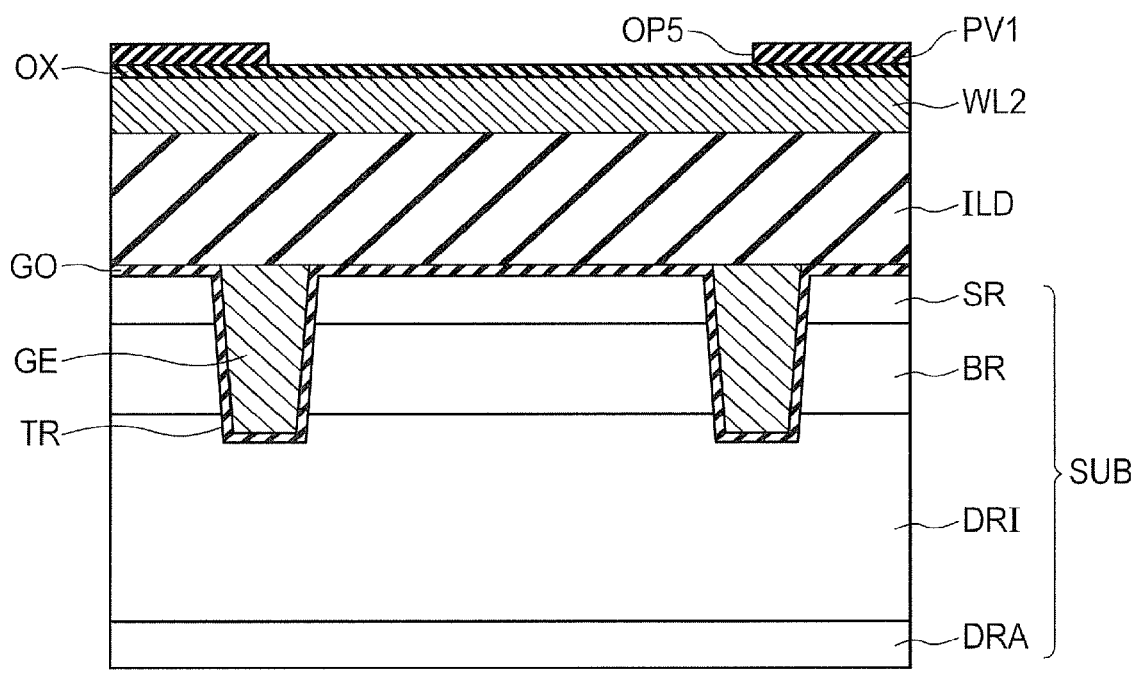
FIG. 18 is a cross-sectional view of the semiconductor device of First Embodiment right below the gate pad in the forming first opening.

As shown in FIGS. 17 and 18, in the first opening formation step S25, an opening OP2 and an opening OP5 are formed. Formation of the opening OP2 and the opening OP5 is performed by partially removing the first passivation film PV1, for example, by photolithography and etching. After the first opening formation step S25, the oxide film OX is exposed from the opening OP2 and the opening OP5.

Figure 19:
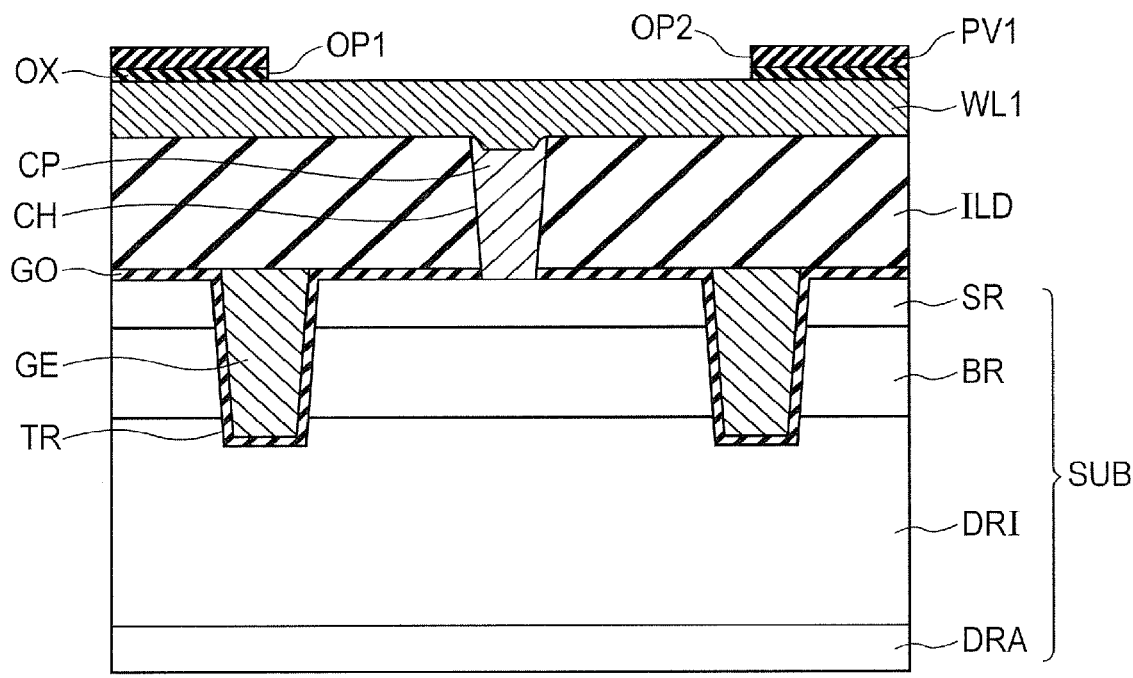
FIG. 19 is a cross-sectional view of the semiconductor device of First Embodiment right below the source pad in a forming second opening.
Figure 20:
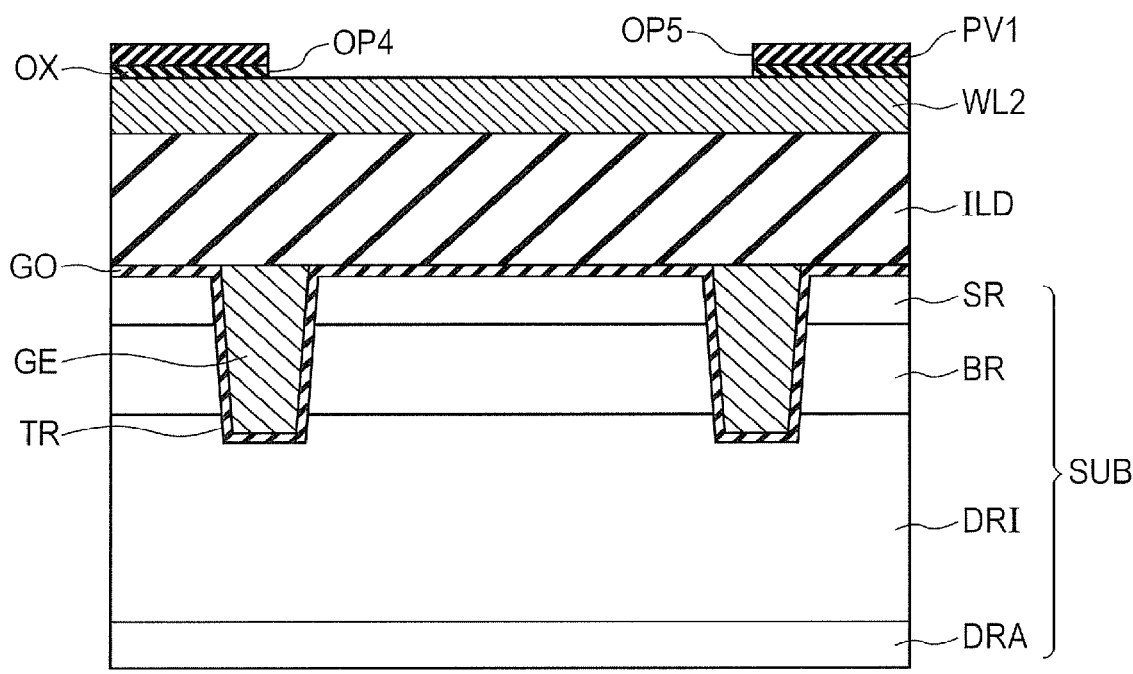
FIG. 20 is a cross-sectional view of the semiconductor device of First Embodiment right below the gate pad in the forming second opening.

As shown in FIGS. 19 and 20, in the second opening formation step S26, an opening OP1 and an opening OP4 are formed. Formation of the opening OP1 and the opening OP4 is performed by dry etching. This dry etching is preferably anisotropic dry etching. More specifically, the second opening formation step S26 is performed, for example, by partially removing the oxide film OX by RIE or the like with the first passivation film PV1 as a mask. Anisotropic dry etching for forming the opening OP1 and the opening OP4 (for partially removing the oxide film OX) is performed preferably for 20 minutes or more to 40 minutes or less. After the second opening formation step S26, the wiring layer WL1 is exposed from the opening OP1 and the opening OP2 and the wiring layer WL2 is exposed from the opening OP3 and opening OP4.

Figure 21:
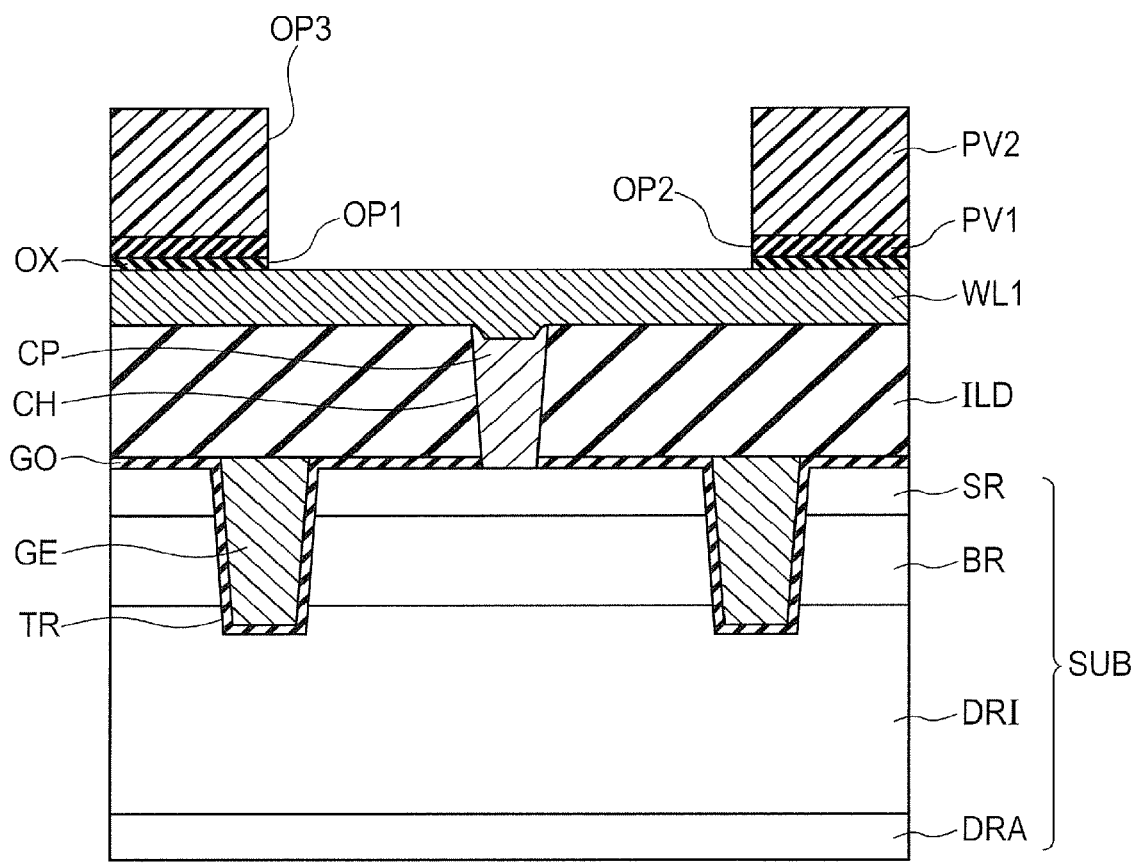
FIG. 21 is a cross-sectional view of the semiconductor device of First Embodiment right below the source pad in a forming second passivation film.
Figure 22:
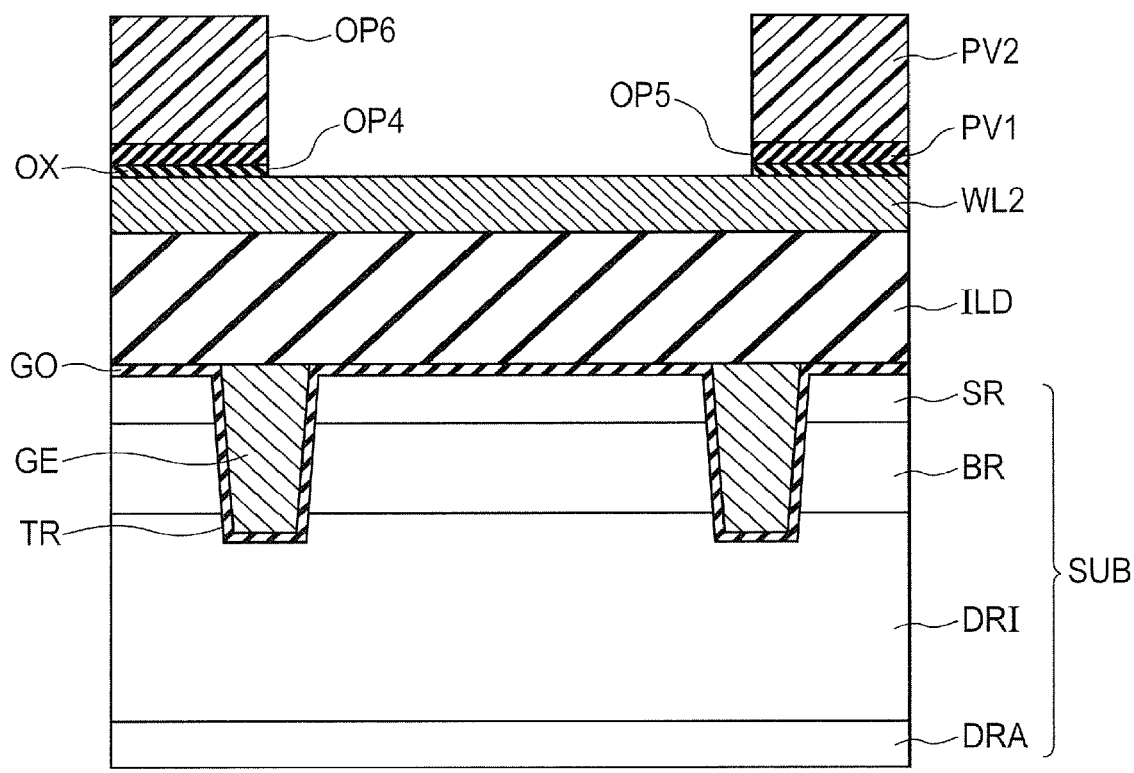
FIG. 22 is a cross-sectional view of the semiconductor device of First Embodiment right below the gate pad in the forming second passivation film.
Figure 23:
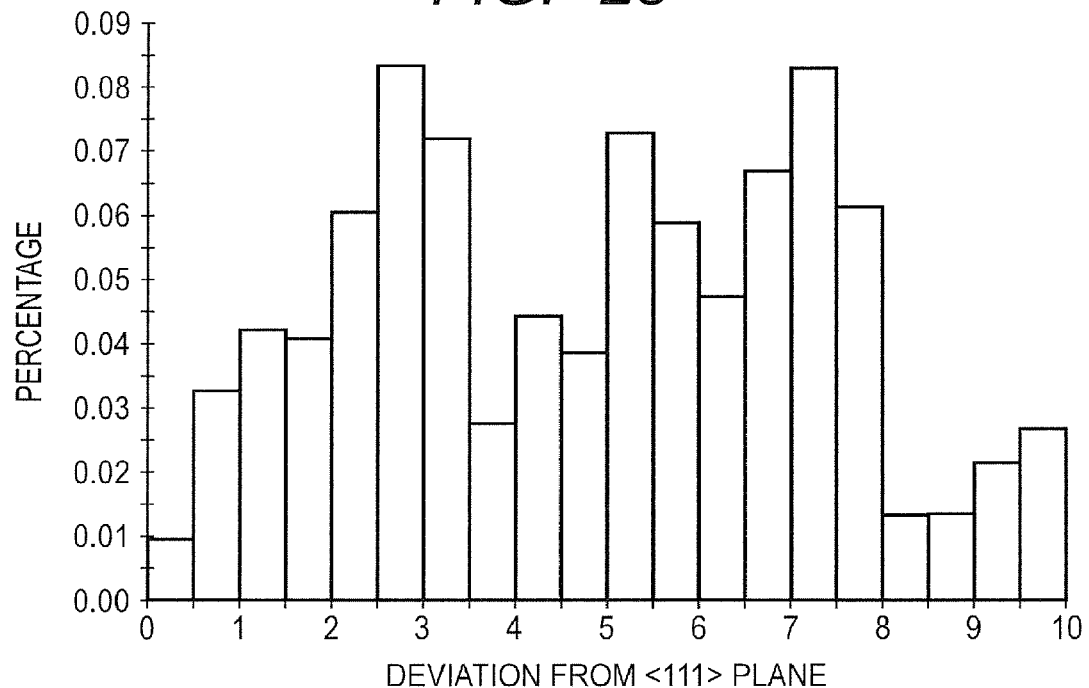
FIG. 23 is a graph showing crystal orientation at the surface of the wiring layer of the semiconductor device of First Embodiment.

As shown in FIGS. 21 and 22, in the second passivation film formation step S27, a second passivation film PV2 is formed. In forming the second passivation film PV2, firstly, a resin material configuring the second passivation film PV2 is applied so as to cover therewith the wiring layer WL1, the wiring layer WL2, and the first passivation film PV1.

Secondly, the resin material configuring the second passivation film PV2 which has been applied is patterned. This patterning is performed, for example, by photolithography to form an opening OP3 and an opening OP6. For the formation of the opening OP3 and the opening OP6, usable is not only photolithography but also any method capable of forming the opening OP3 and the opening OP6 without leaving a residue, which will be an obstacle for a plating film PL1 and a plating film PL2, on the surface of the wiring layer WL1 and the wiring layer WL2 during formation of the opening OP3 and the opening OP6. Thirdly, the resin material configuring the second passivation film PV2 thus patterned is baked. As a result, the second passivation film PV2 provided with the opening OP3 and the opening OP6 is formed.

In the plating film formation step S28, a plating film PL1 and a plating film PL2 are formed. Formation of the plating film PL1 and the plating film PL2 is performed, for example, by electroless plating. More specifically, firstly, the surface of the wiring layer WL1 exposed from the opening OP1, the opening OP2, and the opening OP3 and the surface of the wiring layer WL2 exposed from the opening OP4, the opening OP5, and the opening OP6 are subjected to pretreatment.

This pretreatment includes, for example, cleaning treatment of the surface of the wiring layer WL1 and the wiring layer WL2 by argon (Ar)-containing plasma and zincate treatment of the surface of the wiring layer WL1 and the wiring layer WL2.

Secondly, the plating film PL1 and the plating film PL2 are grown. For the growth of the plating film PL1 and the plating film PL2, the semiconductor substrate SUB is immersed in a plating solution containing a material configuring the plating film PL1 and the plating film PL2. By the above-described steps, the semiconductor device having the structure shown in FIGS. 2 to 5 is manufactured.

(Advantage of Method of Manufacturing Semiconductor Device of First Embodiment)

The advantage of the method of manufacturing the semiconductor device of First Embodiment will hereinafter be described.

The second opening formation step S26 is performed by dry etching. When the second opening formation step S26 is performed after the second passivation film formation step S27, carbon (C) in the second passivation film PV2 is sputtered by Ar or the like contained in the etching gas. The carbon thus sputtered is redeposited on the surface of the wiring layer W1 and the wiring layer WL2 and may hinder the growth of the plating film PL1 and the plating film PL2.

When the second opening formation step S26 is performed after the second the passivation film formation step S27, the surface of the second passivation film PV2 may be graphitized by an etching gas. As the result of graphitization, the second passivation film PV2 may fail to function as a passivation film because of having conductivity.

In the method of manufacturing the semiconductor device of First Embodiment, on the other hand, the second opening formation step S26 is performed prior to the second passivation film formation step S27. At the time when the second opening formation step S26 is performed, therefore, the second passivation film PV2 has not yet been formed and the problem as described above therefore does not occur. According to the method of manufacturing the semiconductor device of First Embodiment, therefore, the plating film PL1 and the plating film PL2 can be grown smoothly on the wiring layer WL1 and the wiring layer WL2, respectively, and adhesion between the wiring layer WL1 and the plating film PL1 and that between the wiring layer WL2 and the plating film PL2 can be improved.

When the wiring layer WL1 and the wiring layer WL2 are formed by sputtering at a temperature of 150° C. or more, the appearance of the semiconductor device in plan view (viewed from a direction orthogonal to the first surface FS) becomes more uniform. This makes it possible to suppress error detection at the time of a visual test of the semiconductor device by using an image processor.

In addition, the contact plug CP is, in the vicinity of the center on the other end side thereof, recessed toward the side of the one end. This tendency is more marked when etch back is performed in the contact plug formation step S22. Formation of the wiring layer WL1 and the wiring layer WL2 by sputtering at a temperature of 150° C. or more improves coverage of the recess. In this case, therefore, coupling failure between the contact plug CP and the wiring layer WL1 or the wiring layer WL2 can be reduced.

According to the finding of the present inventors, on the other hand, when the wiring layer WL1 and the wiring layer WL2 are formed by sputtering at a temperature of 150° C. or more, a proportion, in crystal grains at the surface of the wiring layer WL1 and the wiring layer WL2, of those having a crystal orientation deviated by within 5° from the <111> plane becomes 40% or more. An oxide film OX is grown easily on the crystal grains having a crystal orientation deviated slightly from the <111> plane.

Table 1 shows the relationship between the time of anisotropic dry etching performed in the second opening formation step S26 and defect occurrence (%) of the plating film PL1 and the plating film PL2.

TABLE 1

| Sputtering temperature | Etching time (min) | Defect occurrence (%) |
|---|---|---|
| 150° C. or more | 20 | 0.1 |
| | 30 | 0.1 |
| | 40 | 0.5 |
| | 0 | 74.4 |

As shown in Table 1, in Samples 1 to 4, the wiring layer WL1 and the wiring layer WL2 were formed by sputtering at 150° C. or more.

In Sample 1, the anisotropic dry etching time performed in the second opening formation step S26 was set at 20 minutes. In Sample 2, the anisotropic dry etching time performed in the second opening formation step S26 was set at 30 minutes. In Sample 3, the anisotropic dry etching time performed in the second opening formation step S26 was set at 40 minutes. In Sample 4, the second opening formation step S26 was not performed.

The defect occurrence of the plating film PL1 and the plating film PL2 was determined by dividing the number of semiconductor devices found to have any growth failure in the plating film PL1 and the plating film PL2 by the total number of semiconductor devices to be measured. The presence or absence of the growth failure was detected by observing the plating film PL1 and the plating film PL2 under an optical microscope from a direction perpendicular to the first surface FS.

In Samples 1 to 3, the defect occurrence of the plating film PL1 and the plating film PL2 was 0.5% or less. On the other hand, in Sample 4, the defect occurrence of the plating film PL1 and the plating film PL2 was 74.4%.

Thus, according to the method of manufacturing the semiconductor device of First Embodiment, it is experimentally shown that even if the wiring layer WL1 and the wiring layer WL2 are formed by sputtering at a temperature of 150° C. or more, the plating film PL1 and the plating film PL2 can be grown smoothly.

From another point of view, it is experimentally shown that according to the method of manufacturing the semiconductor device of First Embodiment, the plating film PL1 and the plating film PL2 can be grown smoothly even if a proportion, in crystal grains at the surface of the wiring layer WL1 and the wiring layer WL2, of those having crystal orientation deviated by within 5° from the <111> plane is 40% or more.

In the semiconductor device of First Embodiment, when the thickness T is 1 µm or more, the wiring layer WL1 and the wiring layer WL2 can have reduced electrical resistance.

In the semiconductor device of First Embodiment, when the openings OP1 and OP4 are formed with the first passivation film PV1 (meaning, an insulating inorganic material) as a mask, ashing of a photoresist is not necessary at the time of formation of the openings OP1 and OP4. In this case, therefore, it is possible to prevent re-oxidation of the surface of the wiring layer WL1 exposed from the opening OP1 and the wiring layer WL2 exposed from the opening 4.

Second Embodiment

Second Embodiment will next be described. Difference from First Embodiment will hereinafter be described mainly and overlapping description will be omitted.

A semiconductor device of Second Embodiment has a semiconductor substrate SUB, a gate insulating film GO, a gate electrode GE, an interlayer insulating film ILD, a contact plug CP, a wiring layer WL1, a wiring layer WL2, a first passivation film PV1, a second passivation film PV2, a plating film PL1, and a plating film PL2. The configuration of the semiconductor device of Second Embodiment is similar to that of the semiconductor device of First Embodiment in the above-described points.

The configuration of the semiconductor device of Second Embodiment is however different from that of the semiconductor device of First Embodiment in details of the wiring layer WL1 and the wiring layer WL2.

More specifically, in the semiconductor device of Second Embodiment, a proportion, in the crystal grains at the surface of the wiring layer WL1 and the wiring layer WL2, of those having crystal orientation deviated by 5° or more from the <111> plane is 70% or more.

A method of manufacturing the semiconductor device of Second Embodiment has a front end step S1 and a back end step S2. The back end step S2 has an interlayer insulating film formation step S21, a contact plug formation step S22, a wiring layer formation step S23, a first passivation film formation step S24, a first opening formation step S25, a second opening formation step S26, a second passivation film formation step S27, and a plating film formation step S28. The method of manufacturing the semiconductor device of Second Embodiment is similar to that of First Embodiment in the above-described points.

The method of manufacturing the semiconductor device of Second Embodiment is however different from that of First Embodiment in details of the wiring layer formation step S23. More specifically, in the method of manufacturing the semiconductor device of Second Embodiment, the wiring layer WL1 and the wiring layer WL2 are formed by sputtering at a temperature less than 150° C.

Figure 24:
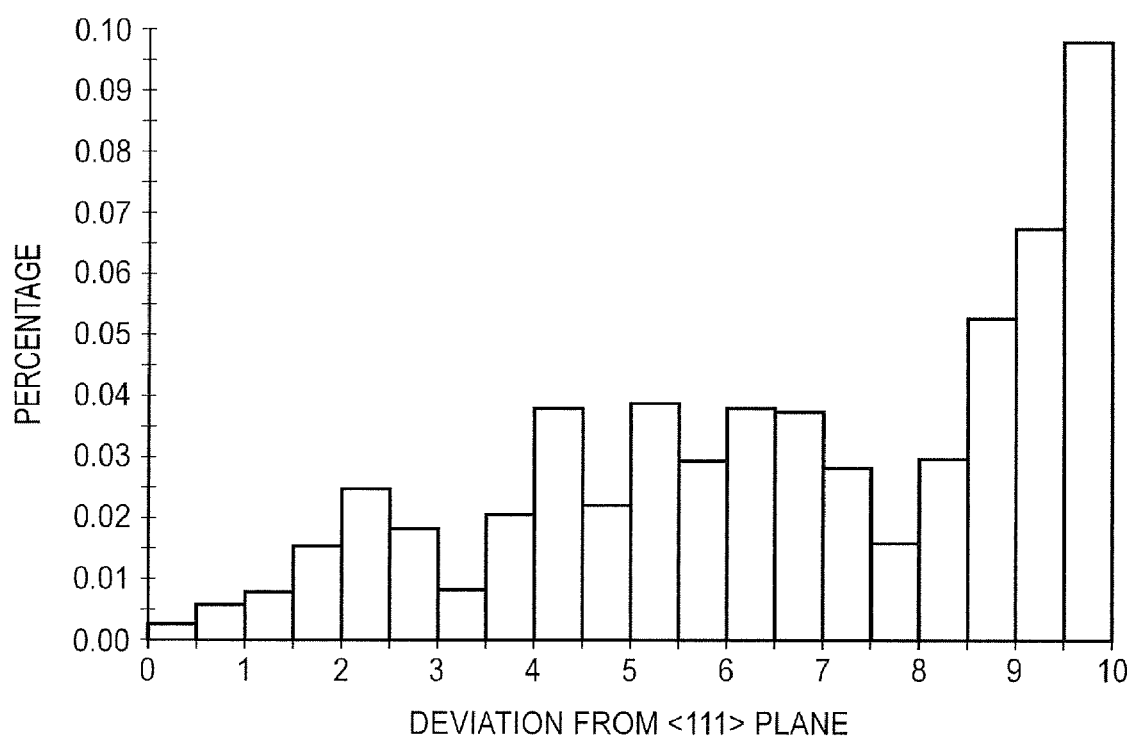
FIG. 24 is a graph showing crystal orientation at the surface of the wiring layer of a semiconductor device of Second Embodiment.

As shown in FIG. 24, according to the finding of the present inventors, when the wiring layer WL1 and the wiring layer WL2 are formed by sputtering at a temperature less than 150° C., a proportion, in the crystal grains at the surface of the wiring layer WL1 and the wiring layer WL2, of those having crystal orientation deviated by 5° or more from the <111> plane becomes 70% or more. An oxide film OX is hard to grow on the crystal grains having crystal orientation deviated largely from the <111> plane. The method of manufacturing the semiconductor device of Second Embodiment therefore can shorten the anisotropic etching time in the second opening formation step S26.

Table 1 shows the relationship between the sputtering temperature for forming the wiring layer WL1 and the wiring layer WL2 and defect occurrence (%) of the plating film PL1 and the plating film PL2, respectively.

TABLE 2

| Sputtering temperature | Etching time (min) | Defect occurrence (%) |
|---|---|---|
| Less than 150° C. | 7 | 5.3 |
| 150° C. or more | | 32.4 |

As shown in Table 2, the wiring layer WL1 and the wiring layer WL2 in Sample 5 were formed by sputtering at a temperature less than 150° C. On the other hand, the wiring layer WL1 and the wiring layer WL2 in Sample 6 were formed by sputtering at a temperature of 150° C. or more. Both in Sample 5 and Sample 6, anisotropic dry etching time in the second opening formation step S26 was set at 7 minutes.

In Sample 5, the defect occurrence of the plating film PL1 and the plating film PL2 was 5.3%. In Sample 6, the defect occurrence of the plating film PL1 and the plating film PL2 was 32.4%. When they are compared while setting the etching time of these samples equal to each other, the defect occurrence of the plating film PL1 and the plating film PL2 formed by sputtering at less than 150° C. becomes smaller drastically. Thus, it has also been confirmed experimentally that the method of manufacturing the semiconductor device of Second Embodiment can shorten the anisotropic etching time in the second opening formation step S26.

The invention made by the present inventors has so far been described specifically based on embodiments. It is needless to say that the invention is not limited to or by these embodiments but can be changed in various ways without departing from the gist of the invention.

What is claimed is:

1. A method of manufacturing a semiconductor device comprising:
   (a) patterning a wiring material by photolithography and etching, using a photoresist as an etching mask, thereby to form a wiring layer over a semiconductor substrate;
   (b) after the step (a), removing the photoresist as the etching mask by ashing treatment, whereby an oxide film is formed on the wiring layer;
   (c) after the step (b), forming a first passivation film of an inorganic material on the oxide film over the wiring layer, the first passivation film having an opening exposing a portion of the oxide film;
   (d) after the step (c), removing the portion of the oxide film exposed from the opening of the first passivation film by dry etching, to form a first opening exposing a portion of the wiring layer in the oxide film;
   (e) after the step (d), forming a second passivation film of an organic material on the first passivation film, the second passivation film having a second opening communicated with the first opening such that the first and second openings expose the portion of the wiring layer; and
   (f) after the step (e), growing a plating film on the portion of the wiring layer exposed from the first opening and the second opening.

2. The method of manufacturing a semiconductor device according to claim 1,
   wherein the oxide film on the wiring layer is formed by oxidation due to the ashing treatment.

3. The method of manufacturing a semiconductor device according to claim 2,
   wherein the first passivation film is a silicon nitride film, and the second passivation film is a polyimide film.

4. The method of manufacturing a semiconductor device according to claim 3,
   wherein the dry etching in the step (d) is sputter etching.

5. The method of manufacturing a semiconductor device according to claim 4,
   wherein the plating film includes a nickel film and an Au film on the nickel film.

* * * * *